United States Patent [19]

Hiraiwa

[11] Patent Number: 5,230,759
[45] Date of Patent: Jul. 27, 1993

[54] PROCESS FOR SEALING A SEMICONDUCTOR DEVICE

[75] Inventor: Katsuro Hiraiwa, Kawasaki, Japan

[73] Assignee: Fujitsu Limited, Kanagawa, Japan

[21] Appl. No.: 928,648

[22] Filed: Aug. 17, 1992

Related U.S. Application Data

[63] Continuation of Ser. No. 599,547, Oct. 18, 1990.

[30] Foreign Application Priority Data

Oct. 20, 1989 [JP] Japan ................... 1-271860

[51] Int. Cl.$^5$ ................................................ B65B 7/00
[52] U.S. Cl. ........................... 156/69; 156/292; 156/315; 156/322; 156/329; 156/330; 174/52.4; 257/702; 257/704; 257/710
[58] Field of Search ............... 156/69, 292, 314, 315, 156/329, 321, 322, 330; 174/52.3, 52.4; 257/678, 701, 702, 704, 710, 711

[56] References Cited

U.S. PATENT DOCUMENTS

| | | | |
|---|---|---|---|
| 4,109,818 | 8/1978 | Hascoe et al. | 156/330 X |
| 4,355,463 | 10/1982 | Burns | 257/704 X |
| 4,534,815 | 8/1985 | Hamada et al. | 156/329 X |
| 4,861,387 | 8/1989 | Matsumoto | 156/315 X |
| 4,974,057 | 11/1990 | Tazima | 357/80 X |
| 5,122,862 | 6/1992 | Kajihara et al. | 257/704 |
| 5,167,744 | 12/1992 | Maan | 156/292 X |

FOREIGN PATENT DOCUMENTS

59-26694 2/1984 Japan ................... 156/330

OTHER PUBLICATIONS

IBM Technical Disclosure Bulletin, vol. 29, No. 8, Jan. 1987, p. 3754, "Membrane Solder Seal/Membrane Epoxy Seal".
IBM Technical Disclosure Bulletin, vol. 27, No. 3, Aug. 1984, p. 1701, "Hermetic Seal for Semiconductor Package".

*Primary Examiner*—David A. Simmons
*Assistant Examiner*—Mark A. Osele
*Attorney, Agent, or Firm*—Nikaido, Marmelstein, Murray & Oram

[57] ABSTRACT

A process for hermetically sealing a cap (7) to a package base (1), on which a semiconductor chip (2) is mounted, by an adhesive resin. First, the base (1) is coated with a thermosetting silicone resin (10) along a frame-shaped abutting portion, then the silicone resin is completely hardened and becomes a silicone rubber, and thereafter, the silicone rubber is coated with a thermosetting sealing resin (11) having a good adhesion with the slicone rubber. The cap is then abutted against the base, and the base and cap are heated while a pressure is exerted thereon to press the base and the cap toward each other.

6 Claims, 2 Drawing Sheets

PROCESS FOR SEALING A SEMICONDUCTOR DEVICE

This application is a continuation of application Ser. No. 599,547 filed Oct. 18, 1990.

BACKGROUND OF THE INVENTION

1. Field of the Invention

This invention relates to a semiconductor device, and more particularly, to a process for hermetically sealing a semiconductor device comprising a package base, on which a semiconductor chip is mounted, and a package cap which is secured and sealed to the base by a resin adhesive.

2. Description of the Related Art

A process for hermetically sealing a package cap onto a package base, on which a semiconductor chip is mounted, by a resin adhesive is well known in the prior art, and such a known process comprises the following steps:

First, a package base is provided with a cavity on which a semiconductor chip is mounted by a resin adhesive in a die-bonding process. The semiconductor chip has a plurality of electric terminals which are connected to inner leads, respectively, of the package base by bonding wires in a wire-bonding process.

The package base is provided at the outer periphery of the cavity with a flat portion which is coated with a thermosetting resin adhesive, and a package cap is then placed on the package base and positioned thereon. The cap is pressed against the package base by a suitable means, such as a pressure clip, to press the cap and the base together in such a way that they can not move relative to each other.

Then, the package comprising the base and cap is introduced into a furnace and the package is heated at a constant temperature, for example, approximately 150° C., to thermoset the resin adhesive, and after a predetermined time, the cap becomes firmly adhered to the base and the package is removed from the furnace. The pressure clip is then removed from the package, and an hermetic sealed semiconductor device is obtained.

The above-mentioned known process for hermetically sealing a package cap onto a package base, however, has several disadvantages, as mentioned below.

The pressure clip is set on the package at a room temperature, such as 20° C. and under atmospheric pressure, and thus the cap is sealed to the package base by an adhesive resin at an ambient pressure. Therefore, after the package is placed in the furnace in which a constant temperature, for example, approximately 150° C., is maintained, the pressure in the cavity of the package becomes higher than the ambient pressure due to an expansion of the air confined in the cavity. For example, assuming that the room temperature is 20° C. and the temperature of the furnace is 150° C., the pressure in the cavity becomes 1.44 times the ambient pressure.

A pressure difference between a high pressure in the package cavity and the ambient pressure in the furnace causes the resin adhesion to be urged toward the outside of the package, and accordingly, the resin adhesive contact area between the package base and the cap is reduced or pin holes are created in the resin adhesive which causes various problems. For example, the sealing force of the resin adhesive is reduced.

SUMMARY OF THE INVENTION

An object of the present invention is to provide a reliable process for hermetically sealing a cap to a package base, by which a desirable sealing force of a resin adhesive provided between the package base and the cap can be obtained.

According to the present invention, there is provided a process for hermetically sealing a semiconductor device comprising a package base, on which a semiconductor chip is mounted, and a package cap, the base and cap having corresponding frame-shaped abutting portions for sealing the cap to the base by a resin adhesive provided between the abutting portions, characterized in that the process comprises the following steps of: coating the frame-shaped abutting portion of at least one of the base and the cap with a thermosetting silicone resin; hardening the silicone resin by heating the one of the base and the cap until said the silicone resin is completely hardened and becomes a silicone rubber; coating the silicone rubber with a thermosetting sealing resin having a good adhesion to the silicone rubber; abutting the cap against the base; and heating the base and the cap while a pressure is exerted thereon to press the base and the cap together.

In the present invention, the silicone resin is completely transformed into a silicone rubber, which functions as a packing seal, and therefore, even if a pressure difference is generated between a high pressure in the package cavity and the ambient pressure in the furnace, the sealing resin is prevented from moving toward the outside and away from the cavity of the package base. Accordingly, a required sealing resin contact area between the package base and the cap can be obtained and the generation of pin holes in the sealing resin can be prevented.

DESCRIPTION OF THE PREFERRED EMBODIMENTS

Figure 1A:
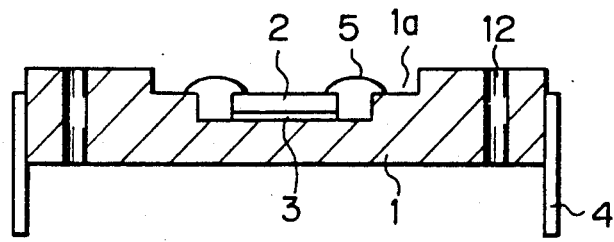
FIGS. 1A through 1D are a series of cross-sectional views illustrating an embodiment of a sealing process for a semiconductor device according to the present invention.

Referring now to the drawings, FIGS. 1A through 1D illustrate a first embodiment of a sealing process for a semiconductor device according to the present invention.

As shown in FIG. 1A, a package base 1, made of a glass epoxy or ceramic, is provided with a cavity 1a in which a semiconductor chip 2 is mounted. The chip 2 is first mounted on the surface of the cavity 1a by a resin adhesive 3, in a die-bonding process. The semiconductor chip 2 has a plurality of electric terminals which are connected to inner leads, respectively, of the package base 1 by bonding wires 5, in a wire-bonding process. The package base 1 is provided with through holes or screw holes 12 for attaching a package cover 7, as will be explained later. In FIG. 1A, reference numeral 4 denotes outer leads provided on the outer wall of the package base 1.

Figure 1B:
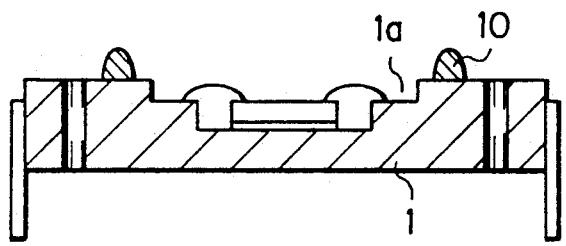

The package base 1 is provided at the outer periphery of the cavity 1a with a flat portion, i.e., a frame-shaped abutting portion. In FIG. 1B, the frame-shaped abutting portion of the package base 1 is coated with a thermosetting silicone resin 10, and this silicon resin 10 is hardened by heating the package base 1 in a furnace (not shown) at a constant temperature for example, approximately 150° C., so that the silicone resin 10 is completely hardened and becomes a silone rubber. Before hardening the thermosetting silicone resin 10 is in liquid state and advantageously has a thixotropic property, so that a cross-sectional shape thereof after coating on the package base 1 remains even during and after the hardening thereof.

Such a silicone resin 10 includes, for example, a filler of allumina, approximately 80%, and has a thixotropic property of 3.0 (viscosity at 6 rpm/viscosity at 30 rpm: revolutional speed of a viscometer).

Figure 1C:
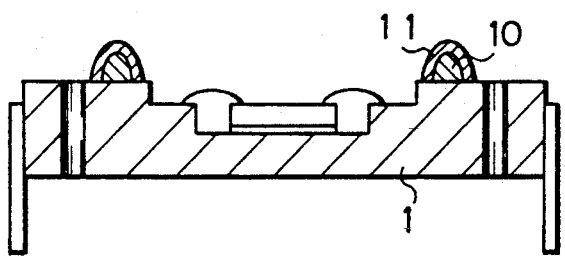

As shown in FIG. 1C, the silicone rubber 10 is then coated with a thermosetting sealing resin 11 having a good adhesion with the silicone rubber, after the silicone resin (rubber) 10 has been completely hardened. The thermosetting sealing resin 11 may be an adhesive silicone resin or an adhesive epoxy resin having a good sealing property.

Figure 1D:
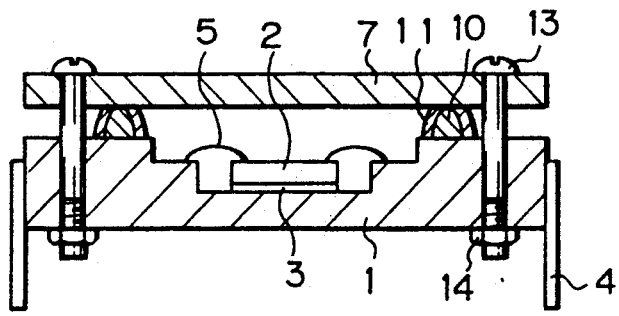

As shown in FIG. 1D, the package cap 7 made of, for example, a metal plate, is provided with through holes at positions corresponding to the holes 12 of the package base 1. Also, the cap 7 is provided with a corresponding frame-shaped abutting portion. Accordingly, the package cap 7 is placed on the package base 1 and positioned thereon, and the package base 1 and the cap 7 are fastened to each other by bolts 13 inserted into the holes 12, and nuts 14, whereby the package base 1 and the cap 7 are pressed together with an appropriate screw torque, for example, 1 to 5 kg.cm. According to this fastening method, the pressure can be adjusted more easily and desirably than the fastening method of the prior art using a pressure clip as mentioned above, and thus the silicon rubber 10 can be properly positioned and adhered to the sealing resin 11.

Then, the semiconductor package comprising the package base 1 and the cap 7 is placed in a furnace (not shown) to heat the package at a constant temperature, for example, approximately 150° C., for a predetermined time such as 1 to 4 hours, to thermoset the sealing resin 11. After the predetermined time has lapsed, the cap 7 is firmly adhered to the package base 1, and the semiconductor package is then removed from the furnace. The bolts 13 and the nuts 14 are left on the package, to maintain the fastening together of the package base 1 and the cap 7.

In the present invention, even though the pressure in the cavity 1a of the package base 1 is made higher than the ambient pressure by an expansion of the air confined in the cavity 1a during the above-mentioned heat-hardening step, the silicone resin has been completely hardened in the previous step and is now a resilient silicone rubber 10, which functions as a packing seal during the heat-hardening step. Therefore, even if a pressure difference is generated between that of the cavity 1a and that outside the package, the sealing resin 11, which has not been completely hardened, is prevented from moving toward the outside from the cavity 1a of the package base 1. Accordingly, a required sealing resin contact area between the package base 1 and the cap 7 can be obtained and the generation of pin holes in the sealing resin can be prevented.

According to an experimental result, it was confirmed that a generation of pin holes was significantly reduced in the embodiment of this invention as follows.

|  | Rate of generation of pin holes |
| --- | --- |
| Prior art (using a pressure clip) | 8/10 (80%) |
| Embodiment of this invention | 0/10 (0%) |

Figure 2:
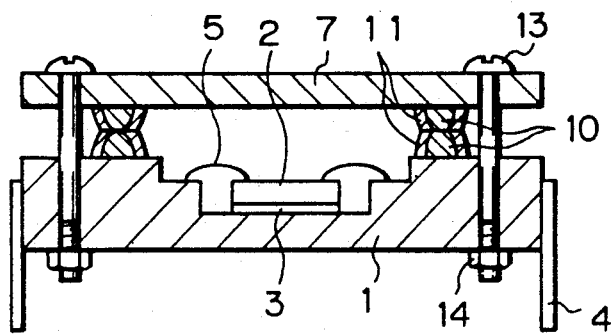
FIG. 2 is a cross-sectional view of a second embodiment of a sealing process of this invention.

FIG. 2 illustrates a second embodiment of a sealing process of this invention. Here, the same or similar members as those of the first embodiment are indicated by the same reference numerals.

In this embodiment, not only the package base 1 but also the cap 7 are provided with corresponding frame-shaped abutting portions, which are both coated with the thermosetting silicone resin 10, respectively. After the silicone resin 10 is hardened to become a silicone rubber, the silicone rubber 10 of the package base 1 and of the cap 7 is coated with a thermosetting sealing resin, respectively. In this embodiment, the same advantages as obtained by the previous embodiment can be thus obtained. Also, in this case, only one of the silicone rubber 10 of the package base 1 and of the cap 7 may be coated with a thermosetting sealing resin.

Figure 3:
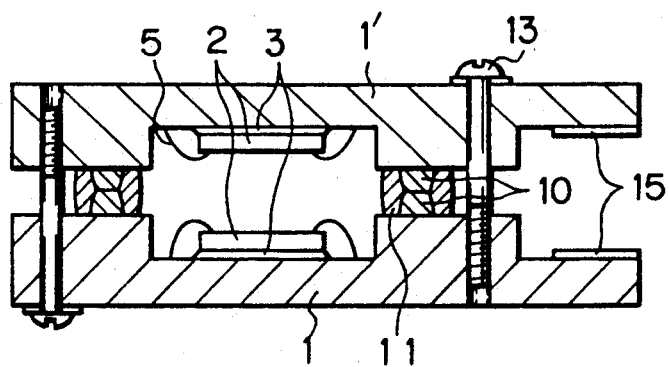
FIG. 3 is a cross-sectional view of a third embodiment of a sealing process of this invention.

FIG. 3 illustrates a third embodiment of a sealing process of this invention. Here, the same or similar members as those of the first and second embodiments are indicated by the same or corresponding reference numerals.

In this embodiment, to manufacture a module type semiconductor device, a second or upper package base 1' is used in place of the cap 7. This upper package base 1' has a same shape and size as the first or lower package base 1, and another semiconductor chip 2 is mounted in a cavity of the upper package base 1'. Accordingly, the lower and upper package bases 1 and 1' have corresponding frame-shaped abutting portions, respectively, which are coated with a thermosetting silicone resin 10, respectively. After the silicone resin of both portions is completely hardened to become a silicone rubber, it is coated with a thermosetting sealing resin 11, respectively. Then, the lower and upper package bases 1 and 1' are abutted against and fastened to each other by bolts 13, and the sealing resin 11 is hardened in the same manner as in the previous embodiments.

In this embodiment, reference numerals 15 refers to outer electric terminals provided on the lower and upper package bases 1 and 1', a socket (not shown) being inserted between these terminals 15 for electrically connecting the same to a cable connector or the like. Also, in this embodiment, the frame-shaped abutting portion of only one of the lower and upper package bases 1 and 1' may be coated with a thermosetting silicone resin 10. Alternatively, only one of the silicone rubber portions 10 may be coated with the sealing resin 11.

It should be understood by those skilled in the art that the foregoing description relates to only a preferred embodiment of the disclosed invention, and that various changes and modifications may be made to the invention without departing from the spirit and scope thereof.

For Example, this invention can be used for hermetically sealing a semiconductor device including a wafer-scale LSI (large scale integrated circuit) in place of an IC chip or an ordinarily sized LSI. Such a wafer-scale LSI has a diameter similar to that of the semiconductor wafer, for example, a diameter of 6 inch or approximately 150 mm.

I claim:

1. A process for hermetically sealing a semiconductor device comprising a package base, on which a semiconductor chip is mounted, and a package cap, said base and cap having corresponding frame-shaped abutting portions for sealing said cap to said base by a resin adhesive provided between said abutting portions, said process comprising the steps of:

coating said frame-shaped abutting portion of one of said base and said cap with a thermosetting silicone resin;

hardening said silicone resin by heating said one of said base and said cap until said silicone resin is completely hardened and becomes a silicone rubber;

coating only said silicone rubber with a thermosetting sealing resin having a good adhesion with said silicon rubber;

abutting said cap against said base; and heating said base and said cap while a pressure is exerted thereon to press said base and said cap toward each other.

2. A process as claimed in claim 1, wherein said silicone resin is hardened at a temperature of approximately 150° C.

3. A process as claimed in claim 1, wherein said thermosetting sealing resin is an epoxy resin.

4. A process as claimed in claim 1, wherein said thermosetting sealing resin is a silicone resin.

5. A process as claimed in claim 1, wherein said pressure is exerted on said base and said cap by a screw means and screw torque is 1–5 kg.cm.

6. A process as claimed in claim 1, wherein said semiconductor chip is a wafer scale LSI.

* * * * *